(12) United States Patent
Shirahata et al.

(10) Patent No.: US 10,211,269 B2
(45) Date of Patent: Feb. 19, 2019

(54) DISPLAY DEVICE WITH NON-PLANAR REFLECTIVE LOWER ELECTRODE

(71) Applicant: Japan Display Inc., Minato-ku (JP)

(72) Inventors: Yuya Shirahata, Minato-ku (JP); Masakazu Gunji, Minato-ku (JP); Toshihiro Sato, Minato-ku (JP)

(73) Assignee: Japan Display Inc., Minato-ku (JP)

( * ) Notice: Subject to any disclaimer, the term of this patent is extended or adjusted under 35 U.S.C. 154(b) by 0 days.

(21) Appl. No.: 15/286,630

(22) Filed: Oct. 6, 2016

(65) Prior Publication Data

US 2017/0117338 A1 Apr. 27, 2017

(30) Foreign Application Priority Data

Oct. 21, 2015 (JP) .................................. 2015-207140

(51) Int. Cl.
*H01L 27/32* (2006.01)
*H01L 51/52* (2006.01)

(52) U.S. Cl.
CPC ...... *H01L 27/3246* (2013.01); *H01L 51/5203* (2013.01); *H01L 51/5209* (2013.01); *H01L 51/5218* (2013.01); *H01L 51/5268* (2013.01); *H01L 51/5271* (2013.01); *H01L 51/5284* (2013.01); *H01L 27/3213* (2013.01)

(58) Field of Classification Search
CPC ............. H01L 27/3246; H01L 51/5284; H01L 51/5271; H01L 51/5203; H01L 51/5268
See application file for complete search history.

(56) References Cited

U.S. PATENT DOCUMENTS

| 7,030,556 | B2 * | 4/2006 | Adachi | ............... | H01L 27/3246 313/110 |
| 2003/0201447 | A1 * | 10/2003 | Yamazaki | ........... | H01L 27/3246 257/79 |
| 2004/0160165 | A1 * | 8/2004 | Yamauchi | ........... | H01L 27/3246 313/498 |

(Continued)

FOREIGN PATENT DOCUMENTS

JP 2015-50011 3/2015

OTHER PUBLICATIONS

Janssen, J. E., et al. Normal spectral reflectance of anodized coatings on aluminum, magnesium, titanium, and beryllium (ASD Technical Report 61-147). OH: Aeronautical Systems Division, Air Force Systems Command, United States Air Force (1961).*

(Continued)

*Primary Examiner* — Lex H Malsawma
*Assistant Examiner* — Gardner W. S. Swan
(74) *Attorney, Agent, or Firm* — Oblon, McClelland, Maier & Neustadt, L.L.P.

(57) ABSTRACT

A display device includes a plurality of emitting elements corresponding to a plurality of pixels. The emitting element includes a lower electrode, an upper electrode having a light-transmitting property, and a light-emitting layer between the lower electrode and the upper electrode. The lower electrode includes a flat portion and an inclined portion that is inclined obliquely upward and outward from the central area of the flat portion. Both of the flat portion and the inclined portion include a reflective surface respectively. The reflective surface of the flat portion has a light reflectance lower than that of the reflective surface of the inclined portion.

6 Claims, 12 Drawing Sheets

1A

(56) References Cited

U.S. PATENT DOCUMENTS

2011/0297944 A1* 12/2011 Choi .................... H01L 27/124
257/59
2015/0060820 A1 3/2015 Takagi et al.

OTHER PUBLICATIONS

Bates, S. C. (Nov. 19, 2010) Next generation transparent furnace. Retrieved from The Wayback Machine, https://web.archive.org/web/20101119060901/http://www.tvu.com/PNextGenTFWeb.html.*

* cited by examiner

DISPLAY DEVICE WITH NON-PLANAR REFLECTIVE LOWER ELECTRODE

CROSS-REFERENCE TO RELATED APPLICATION

The present application claims priority from Japanese application JP2015-207140 filed on Oct. 21, 2015, the content of which is hereby incorporated by reference into this application.

BACKGROUND OF THE INVENTION

1. Field of the Invention

The present invention relates to a display device.

2. Description of the Related Art

In a display device using the electroluminescence of an organic material, a light-emitting layer made of an organic compound or the like is present between a lower electrode and an upper electrode, and a current flowing between the lower electrode and the upper electrode causes the light-emitting layer to emit light. The light generated from the light-emitting layer is directed in various directions. By directing the light in the front direction with respect to a display surface of the display device, light extraction efficiency can be improved.

In a display device disclosed in JP 2015-050011 A, a step is formed in an insulating layer (insulating layer 104 in JP 2015-050011 A) in the cross-sectional view, and a lower electrode (first electrode 106 in JP 2015-050011 A) is formed over the upper surface of the step of the insulating layer, the inclined surface constituting the sidewall portion of the step, and the bottom surface of the insulating layer where the step is not formed. In light generated from a light-emitting layer (organic EL layer 110 in JP 2015-050011 A) disposed on the lower electrode, portion of the light traveling in a direction substantially parallel to the light-emitting layer, or portion of the light totally reflected at the interface between the lower electrode located on the bottom surface of the insulating layer and the light-emitting layer is reflected by the lower electrode located on the inclined surface of the insulating layer, and is directed upward, that is, directed in the front direction with respect to a display surface of the display device. With this configuration, the light extraction efficiency of the display device can be improved.

SUMMARY OF THE INVENTION

In the display device, the upper electrode formed above the bottom surface of the insulating layer mainly reflects not only the light generated from the light-emitting layer but also light (external light) from outside the display device. Therefore, a reflection of the outside scenery is seen on the display surface, leading to the problem of reduced visibility of a display image. As a countermeasure to reduce the external light reflection, bonding a circular polarizer to the display surface is known. However, since the circular polarizer also attenuates the light radiated from the light-emitting layer, the light extraction efficiency of the display device is reduced.

It is an object of the invention to suppress external light reflection while ensuring the light extraction efficiency of a display device.

A display device according to an aspect of the invention includes a plurality of emitting elements corresponding to a plurality of pixels, wherein each of the plurality of emitting elements includes a lower electrode, an upper electrode having a light-transmitting property, and a light-emitting layer between the lower electrode and the upper electrode, the lower electrode includes a flat portion and an inclined portion that is inclined obliquely upward and outward from a central area of the flat portion, both the flat portion and the inclined portion include a reflective surface respectively, and the reflective surface of the flat portion has a light reflectance lower than that of the reflective surface of the inclined portion. A display device according to another aspect of the invention includes: a plurality of pixels; a bank layer dividing the plurality of pixels and including a first opening; lower electrodes each included in the plurality of pixels; an upper electrode disposed over the plurality of pixels; an organic layer located between the lower electrode and the upper electrode and including a light-emitting layer; and an insulating layer covering the bank layer and including a second opening exposing a portion of each of the lower electrodes, wherein each of the lower electrodes may include a first area exposed by the second opening, and a second area located between a side surface of the bank layer and a side surface of the insulating layer and in contact with the side surface of the bank layer, and the first area may have a light reflectance lower than that of the second area. According to the aspects of the invention, it is possible to suppress external light reflection while ensuring the light extraction efficiency of the display device.

DETAILED DESCRIPTION OF THE INVENTION

1. First Embodiment

Figure 1:
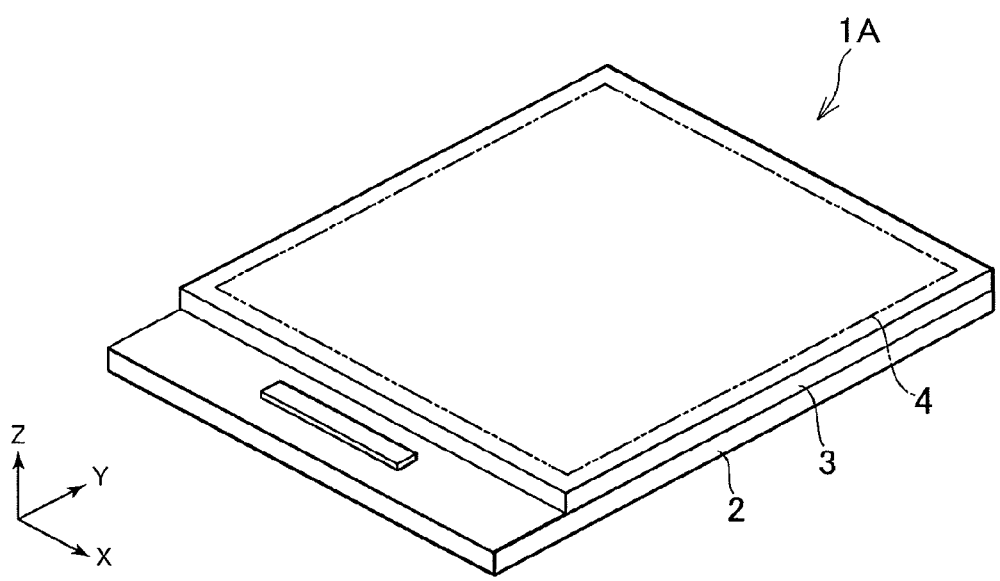
FIG. 1 is a perspective view schematically showing a display device according to a first embodiment.

Hereinafter, exemplary embodiments as forms for implementing the invention will be described. First, a display device 1A according to a first embodiment will be described. FIG. 1 is a perspective view schematically showing the display device 1A according to the first embodiment. As shown in FIG. 1, the display device 1A includes two substrates, a thin film transistor (TFT) substrate 2 and a counter substrate 3, between which a filler 70 (see FIG. 3) is filled. A display area 4 where an image is displayed is provided on one surface of the display device 1A. The display device 1A receives an image signal through various kinds of publicly known devices and thus displays an image in the display area 4.

Figure 2:
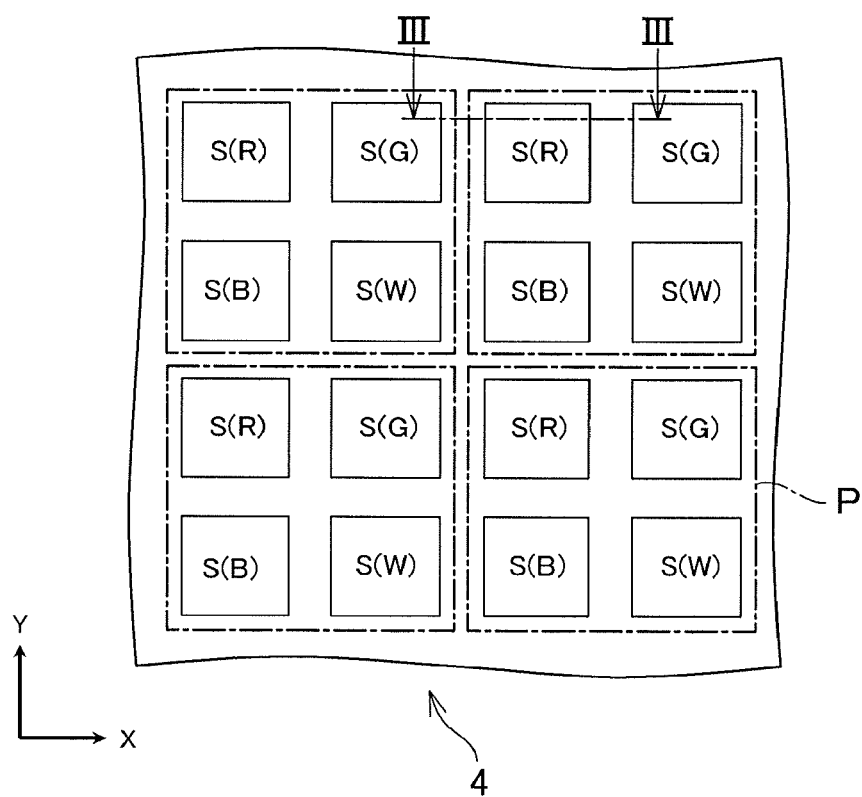
FIG. 2 is a plan view showing an exemplary layout of pixels in a display area.

FIG. 2 is a plan view showing an exemplary layout of pixels P in the display area 4. As shown in FIG. 2, the plurality of pixels P are formed in the display area 4. The plurality of pixels P are arranged in the horizontal direction (X-direction in FIG. 2) and the vertical direction (Y-direction in FIG. 2). Each of the pixels P is composed of a plurality of unit pixels S. The display device 1A includes, as the unit pixels S, a red component pixel S(R) that emits red light, a green component pixel S(G) that emits green light, a blue component pixel S(B) that emits blue light, and a white component pixel S(W) that emits white light. An exemplary layout of the pixel P is not limited to this example. For example, the pixel P may be composed of three unit pixels not including the white unit pixel S(W). Moreover, the unit pixel may be simply referred to as "pixel".

Figure 3:
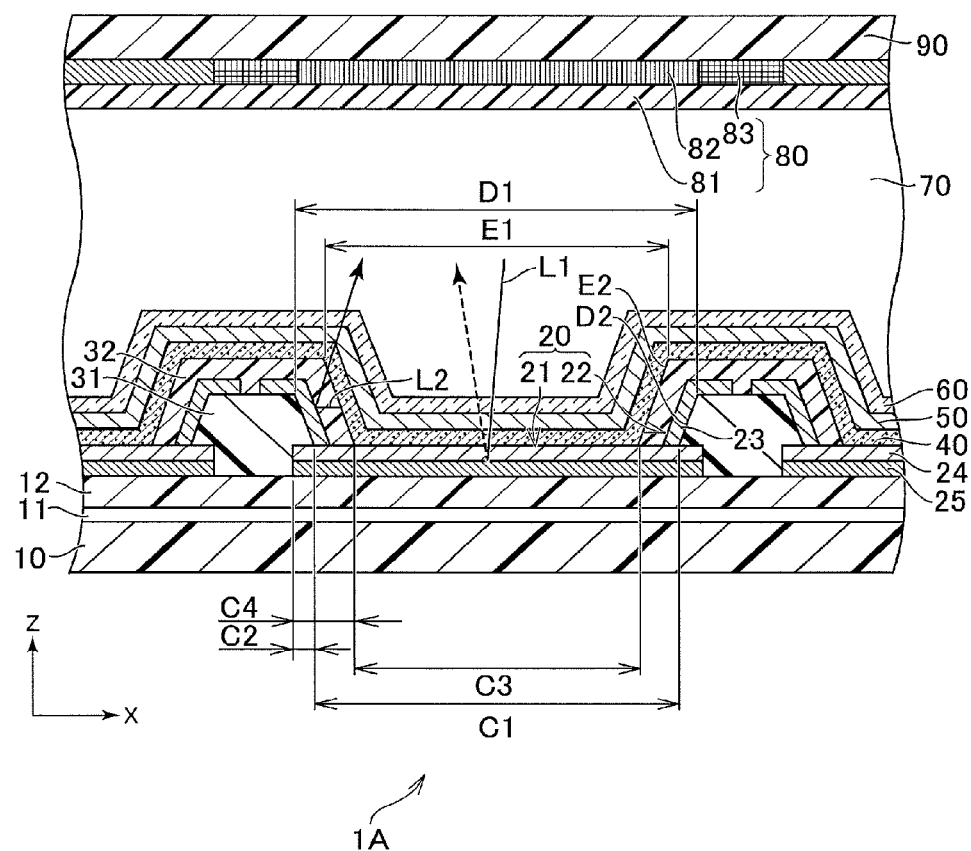
FIG. 3 is a cross-sectional view schematically showing a cross-section of the display device according to the first embodiment.
Figure 4:
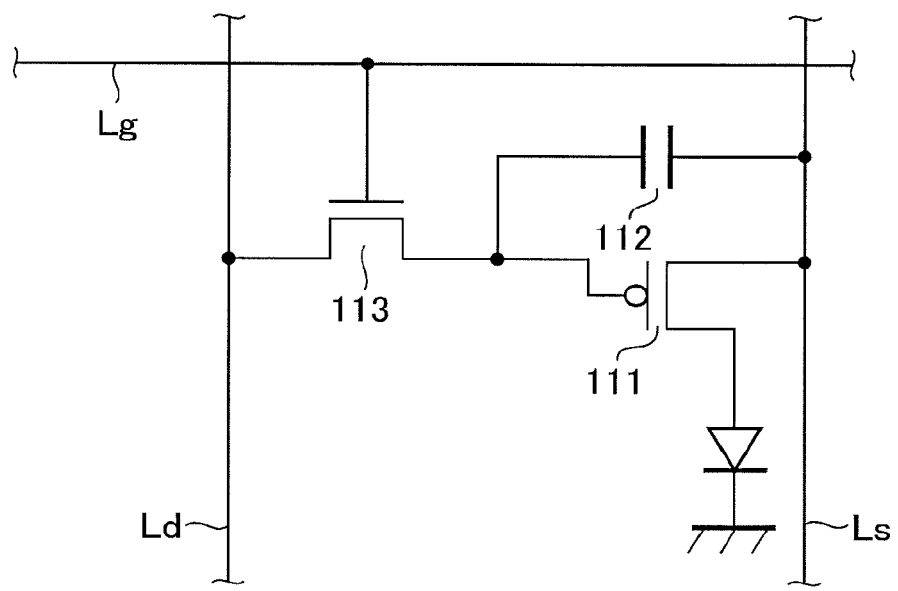
FIG. 4 is a circuit diagram showing a circuit formed in a unit pixel.

FIG. 3 is a cross-sectional view schematically showing a cross-section of the display device 1A, taken along a cutting plane indicated by the line in FIG. 2. FIG. 4 is a circuit diagram showing a circuit formed in the unit pixel S. As shown in FIG. 3, the TFT substrate 2 includes a substrate 10. The substrate 10 is formed of a glass substrate, a resin substrate, a film substrate, or the like. A circuit layer 11 into which a plurality of pixel control circuits F shown in FIG. 4 are incorporated is formed on the substrate 10.

A planarization layer 12 made of an insulating material and including a substantially flat upper surface in the display area 4 is formed on the circuit layer 11. The planarization layer 12 is, for example, an organic planarization film or organic passivation film formed over the plurality of pixel control circuits F included in the circuit layer 11.

A plurality of lower electrodes 20 are formed on the planarization layer 12. The plurality of lower electrodes 20 and the plurality of pixel control circuits F correspond to the plurality of unit pixels S. Although not shown in the drawing, the plurality of lower electrodes 20 are electrically connected with the plurality of pixel control circuits F.

As shown in FIG. 4, a scanning line Lg extending in the horizontal direction, a video signal line Ld extending in the vertical direction, and a power source line Ls extending in the vertical direction are formed as wirings in the pixel control circuit F incorporated into the circuit layer 11. The pixel control circuit F includes TFTs and a capacitor, and controls the supply of a current to the lower electrode 20. The pixel control circuit F includes a driver TFT 111, a storage capacitor 112, and a switching TFT 113. A gate of the switching TFT 113 is connected to the scanning line Lg, and a drain of the switching TFT 113 is connected to the video signal line Ld. A source of the switching TFT 113 is connected to the storage capacitor 112 and a gate of the driver TFT 111. A drain of the driver TFT 111 is connected to the power source line Ls, and the lower electrode 20 is connected to a source of the driver TFT 111. The switching TFT 113 is brought into ON-state in response to the application of a gate voltage to the scanning line Lg. In this case, when a video signal is supplied from the video signal line Ld, charge builds up on the storage capacitor 112. With the charge building up on the storage capacitor 112, the driver TFT 111 is brought into ON-state to allow a current to flow from the power source line Ls to the lower electrode 20, and a light-emitting layer 40 and an upper electrode 50 both described later, so that the light-emitting layer 40 emits light.

As shown in FIG. 3, a bank layer 31 formed of an insulating material such as resin is stacked on the planarization layer 12. In FIG. 2, the portion surrounding the unit pixel S is the bank layer 31. As shown in FIG. 2, the bank layer 31 is disposed so as to surround the outer periphery of each of the plurality of unit pixels S. As shown in FIGS. 2 and 3, a first upper opening D1 including an inner circumferential surface D2 (side surface) that is inclined obliquely upward and outward is formed in the bank layer 31. The plurality of lower electrodes 20 are disposed independently of each other for each of the unit pixels S with the bank layer 31. The lower electrodes 20 are electrically isolated from each other. As shown in FIG. 3, an insulating layer 32 made of a transparent insulating material is formed on the bank layer 31. In the insulating layer 32, a second upper opening E1 including an inner circumferential surface E2 (side surface) that is inclined obliquely upward and outward is formed. In a plan view, the second upper opening E1 is formed inside the first upper opening D1. The insulating layer 32 prevents a short-circuit between each of the plurality of lower electrodes 20 and the upper electrode 50 described later.

The light-emitting layer 40 and the upper electrode 50 having a light-transmitting property are formed so as to cover the top surface below which the plurality of lower electrodes 20 and the insulating layer 32 are formed. The upper electrode 50 is formed of a transparent conductive material such as indium tin oxide (ITO) or indium zinc oxide (IZO), and disposed over the plurality of unit pixels S in the display area 4. The light-emitting layer 40 is present between the plurality of lower electrodes 20 and the upper electrode 50. A current flowing between the lower electrode 20 and the upper electrode 50 through the light-emitting layer 40 causes the light-emitting layer 40 to emit light, and the luminance thereof is controlled by the amount of the current flowing between the electrodes. As the light-emitting layer 40, an organic layer made of, for example, an organic compound is used. Between the lower electrode 20 and the upper electrode 50, an organic layer including the light-emitting layer 40 and at least one of an electron injection layer, an electron transport layer, a hole injection layer, and a hole transport layer, or a stacked body of the organic layer may be disposed.

The display device 1A includes a plurality of emitting elements (or self-emitting elements) corresponding to the plurality of unit pixels S constituting an image. In the embodiment, the lower electrode 20, the light-emitting layer 40, and the upper electrode 50 constitute the emitting element layer corresponding to each of the unit pixels S.

A sealing layer 60 is formed so as to cover the surface below which the upper electrode 50 is formed. The sealing layer 60 is formed of, for example, a transparent inorganic material such as SiOx or SiNy, and has the function of preventing the entry of oxygen or moisture into the light-emitting layer 40.

The counter substrate 3 shown in FIG. 1 is disposed so as to face the TFT substrate 2. The counter substrate 3 includes a substrate 90 shown in FIG. 3, and a color filter layer 80 is formed below the substrate 90. The color filter layer 80 includes color filters 82 each of which transmits light in a predetermined color, for the plurality of unit pixels S. The color filter 82 transmits, for example, red, green, blue, or white light. A light-shielding film 83 is disposed between the two color filters 82 next to each other. An overcoat layer 81 made of an organic material is formed on the lower surfaces of the color filters 82 and the light shielding film 83.

The filler 70 is filled between the TFT substrate 2 and the counter substrate 3 (more specifically, above the upper electrode 50). The filler 70 is formed of, for example, a transparent filling material flowing into a place surrounded by a sealing material that is disposed outside the display area 4 to function as a dam.

The display device 1A according to the embodiment employs a top emission system in which the lower electrode 20 is configured to include a reflective surface that reflects light. That is, the light emitted from the light-emitting layer 40 is reflected by the lower electrode 20 and emitted to the upper side of the display device 1A. More specifically, the lower electrode 20 includes a flat portion 21 formed on the upper side of the planarization layer 12 and including a flat upper surface in the up-and-down direction, and an inclined portion 22 (second area) that is inclined in an obliquely upward and outward direction from a central area C1 of the flat portion 21 including at least the center thereof. The central area C1 is an area exposed through a first lower opening (opening formed inside the first upper opening D1 and not including the inner circumferential surface D2) in the bank layer 31. A reflective surface that reflects incident light from the light-emitting layer 40 is formed on the flat portion 21 and the inclined portion 22.

In the embodiment, the lower electrode 20 is formed to include a first reflective layer 23 and a second reflective layer 25 both made of a conductive material that reflects light, and a conductive layer 24 made of a conductive material that transmits light, such as ITO or IZO. The second reflective layer 25 is stacked on the planarization layer 12. The conductive layer 24 is stacked on the second reflective layer 25. The first reflective layer 23 is disposed on the inclined surface of the bank layer 31, and the edge of the first reflective layer 23 is in contact with the upper surface of the conductive layer 24. The flat portion 21 of the lower electrode 20 is formed in the second reflective layer 25 and the conductive layer 24, and the inclined portion 22 is formed in the first reflective layer 23.

The bank layer 31 overlies a peripheral edge area C2 that is an area containing the edge of the flat portion 21 in the lower electrode 20 and does not overlap the central area C1. In the bank layer 31, the first upper opening D1 including the inner circumferential surface D2 (i.e., the inclined surface of the bank layer 31) inclined obliquely upward and outward so as to surround the central area C1 of the flat portion 21 is formed. The light generated in the light-emitting layer 40 passes through the first upper opening D1 to be emitted to the outside of the display device 1A. The inclined portion 22 of the lower electrode 20 is formed on the inner circumferential surface of the bank layer 31.

The insulating layer 32 overlies a peripheral edge portion C4 that is the peripheral edge of the flat portion 21 in the lower electrode 20, and covers the bank layer 31 and the inclined portion 22 of the lower electrode 20. Moreover, the insulating layer 32 exposes the upper surface of a central portion C3 (first area) of the flat portion 21 including at least the center thereof. The central portion C3 is an area exposed by a second lower opening (opening formed inside the second upper opening E1 and not including the inner circumferential surface E2) in the insulating layer 32. Since the insulating layer 32 is formed in the peripheral area C2, a short-circuit between the lower electrode 20 and the upper electrode 50 can be prevented in the peripheral area C2 even when the light-emitting layer 40 is discontinued.

In the lower electrode 20, the flat portion 21 is formed such that the function of attenuating incident light from the light-emitting layer 40 is higher in the flat portion 21 than in the inclined portion 22. More specifically, the second reflective layer 25 functioning as the reflective surface of the flat portion 21 is formed of a material having a low light reflectance so that the second reflective layer 25 has a light reflectance lower than that of the first reflective layer 23 functioning as the reflective surface of the inclined portion 22. For example, when the first reflective layer 23 is formed of Al, the second reflective layer 25 may be formed of a material (Mo, etc.) having a light reflectance lower than that of Al.

By making the light reflectance of the reflective surface in the flat portion 21 lower than the light reflectance of the reflective surface in the inclined portion 22 as described above, incident light L1 incident on the flat portion 21 is attenuated, and thus the reflection of light directed from the flat portion 21 toward the outside of the display device 1A can be suppressed. Further, since the reflective surface of the inclined portion 22 has a light reflectance higher than that of the reflective surface of the flat portion 21, incident light L2 incident from the light-emitting layer 40 on the inclined portion 22 can be reflected with a high luminance. That is, it is possible to suppress external light reflection while ensuring light extraction efficiency in the display device 1A.

2. Second Embodiment

Figure 5:
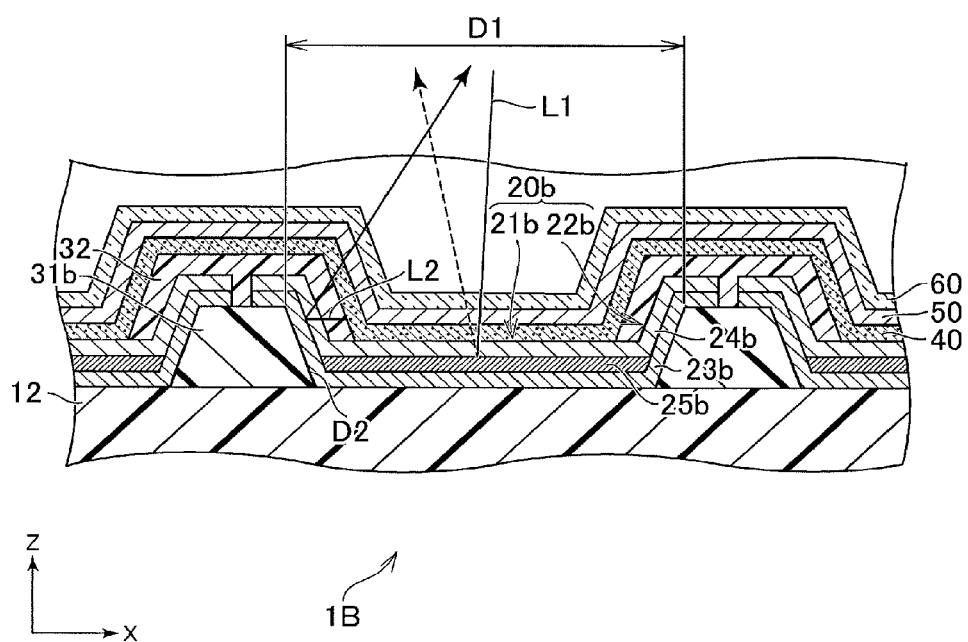
FIG. 5 is a cross-sectional view showing a portion of a cross-section of a display device according to a second embodiment.

Next, a display device 1B according to a second embodiment will be described. FIG. 5 is a cross-sectional view showing a portion of a cross-section of the display device 1B, corresponding to FIG. 3 in the first embodiment. As shown in FIG. 5, the display device 1B according to the embodiment includes, similarly to the first embodiment, a bank layer 31b in which the first upper opening D1 including the inner circumferential surface D2 inclined obliquely upward and outward is formed. A lower electrode 20b included in the display device 1B is formed to include a first reflective layer 23b made of a conductive material (e.g., Al) that reflects light, a second reflective layer 25b made of a conductive material (e.g., Mo) having a light reflectance lower than that of the first reflective layer 23b, and a conductive layer 24b made of a transparent conductive material such as ITO.

Specifically, the first reflective layer 23b is formed on the bank layer 31b and inside the first upper opening D1. The second reflective layer 25b is formed on the first reflective layer 23b while avoiding overlapping at least the upper end portion of the inner circumferential surface D2 inside the first upper opening D1. The second reflective layer 25b is a flat portion 21b (i.e., a portion where a flat upper surface is formed in the up-and-down direction), and a portion of the first reflective layer 23b overlapping the inner circumferential surface D2 and exposed from the second reflective layer 25b is an inclined portion 22b.

The conductive layer 24b is disposed on the first reflective layer 23b and the second reflective layer 25b, and covers the inner circumferential surface D2. The first reflective layer 23b and the conductive layer 24b are in contact with each other on the inner circumferential surface D2, and are divided on the bank layer 31b for each of the unit pixels S. Although not shown in the drawing, a conductive layer of ITO or the like having a light-transmitting property may be formed between the first reflective layer 23b and the second reflective layer 25b. In this case, the lower electrode 20b may not necessarily include the conductive layer 24b.

By forming the lower electrode 20b as described above, a light reflectance in the flat portion 21b is made lower than a light reflectance in the inclined portion 22b similarly to the first embodiment, and thus it is possible to attenuate the incident light L1 incident from the outside of the display device 1B on the flat portion 21b while suppressing the attenuation of the incident light L2 incident from the light-emitting layer 40 on the inclined portion 22b. That is, it is possible to suppress external light reflection while ensuring the light extraction efficiency of the display device 1B.

3. Third Embodiment

Figure 6:
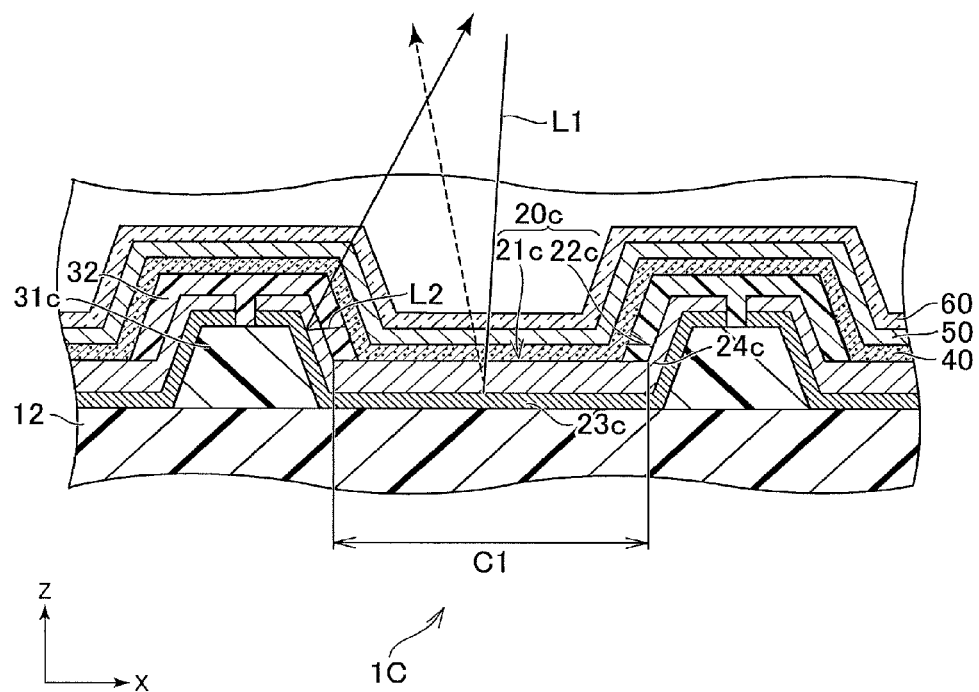
FIG. 6 is a cross-sectional view showing a portion of a cross-section of a display device according to a third embodiment.

Next, a display device 1C according to a third embodiment will be described. FIG. 6 is a cross-sectional view showing a portion of a cross-section of the display device 1C, corresponding to FIG. 3 in the first embodiment. As shown in FIG. 6, the display device 1C according to the embodiment includes a bank layer 31c similar to that of the second embodiment, a lower electrode 20c, and an upper electrode 50 formed on the light-emitting layer 40 above the lower electrode 20c. The lower electrode 20c includes a reflective layer 23c made of a conductive material that reflects light, such as Al, and a medium layer 24c made of a transparent conductive material such as ITO. In the lower electrode 20c, the reflective layer 23c and the medium layer 24c are formed over a flat portion 21c and an inclined portion 22c that is inclined obliquely upward and outward from the central area C1 including at least the center of the flat portion 21c.

In the lower electrode 20c, the medium layer 24c is stacked on the reflective layer 23c. The medium layer 24c in the flat portion 21c has a light absorption higher than that of the medium layer 24c in the inclined portion 22c. More specifically, the medium layer 24c in the flat portion 21c is thicker than the medium layer 24c in the inclined portion 22c in the up-and-down direction. By forming especially the medium layer 24c in the flat portion 21c to be thick as described above, the incident light L1 incident on the flat portion 21c is attenuated, and thus the reflection of light directed from the flat portion 21c toward the outside of the display device 1C can be suppressed. Moreover, the medium layer 24c in the inclined portion 22c is thinner than the medium layer 24c in the flat portion 21c. For this reason, a light absorption with respect to the incident light L2 incident from the light-emitting layer 40 on the inclined portion 22c is reduced compared with a light absorption with respect to the incident light L1. That is, it is possible to ensure the light extraction efficiency of the display device 1C while suppressing external light reflection in the display device 1C.

Further, the upper electrode 50 formed in the display device 1C includes, directly above the flat portion 21c formed in the lower electrode 20c, a thick film portion 51c that is the thickest portion to provide the highest light absorption. By forming the thick film portion 51c in the upper electrode 50 as described above, incident light incident on the flat portion 21c can be further attenuated, and thus it is possible to further suppress external light reflection in the display device 1C.

4. Fourth Embodiment

Figure 7:
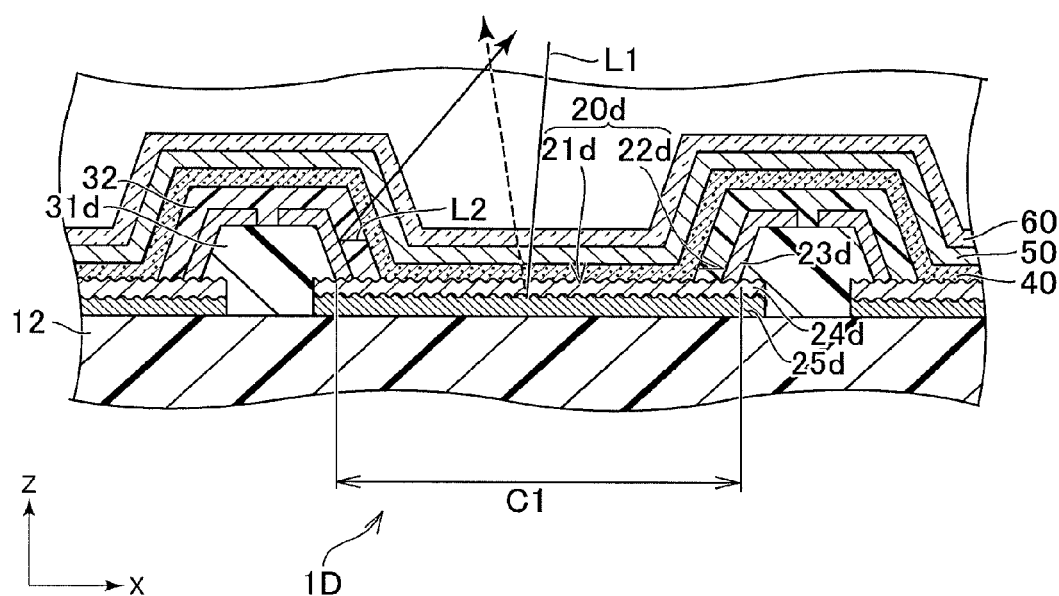
FIG. 7 is a cross-sectional view showing a portion of a cross-section of a display device according to a fourth embodiment.

Next, a display device 1D according to a fourth embodiment will be described. FIG. 7 is a cross-sectional view showing a portion of a cross-section of the display device 1D, corresponding to FIG. 3 in the first embodiment. As shown in FIG. 7, a lower electrode 20d formed in the display device 1D includes, similarly to the first embodiment, a flat portion 21d including a flat upper surface in the up-and-down direction, and an inclined portion 22d that extends obliquely upward and outward from the central area C1 including the center of the flat portion 21d. The inclined portion 22d includes a first reflective layer 23d made of a conductive material that reflects light, and the flat portion 21d includes a second reflective layer 25d made of a conductive material that similarly reflects light. The lower electrode 20d includes a conductive layer 24d of ITO or the like having a light-transmitting property and stacked on and in contact with the flat portion 21d. In the embodiment, the second reflective layer 25d may be formed of the same material (e.g., a metal material such as Al) as the first reflective layer 23d.

In the embodiment, the upper surface of the second reflective layer 25d, which is the reflective surface of the flat portion 21d, is formed so as to have a degree of light diffuse reflection higher than that of the upper surface of the first reflective layer 23d, which is the reflective surface of the inclined portion 22d. More specifically, the reflective surface of the flat portion 21d is formed so as to have a surface roughness higher than that of the reflective surface of the inclined portion 22d. In a manufacturing process of the display device 1D, the second reflective layer 25d with a rough upper surface is formed on the planarization layer 12, and thereafter, the conductive layer 24d having a light-transmitting property is formed on the second reflective layer 25d. The lower surface of the conductive layer 24d is roughened corresponding to the surface roughness of the upper surface (i.e., the reflective surface of the flat portion 21d) of the second reflective layer 25d, and also the upper surface of the conductive layer 24d is roughened according to the lower surface of the conductive layer 24d.

By increasing the surface roughness of the reflective surface in the flat portion 21d as described above, the incident light L1 incident on the flat portion 21d can be diffusely reflected. That is, it is possible to suppress external light reflection in the display device 1D. Moreover, by making the roughness of the reflective surface in the inclined portion 22d lower than that of the flat portion 21d, the diffusion of the incident light L2 incident from the light-emitting layer 40 on the inclined portion 22d can be suppressed, and thus light extraction efficiency in the display device 1D can be ensured.

5. Fifth Embodiment

Figure 8:
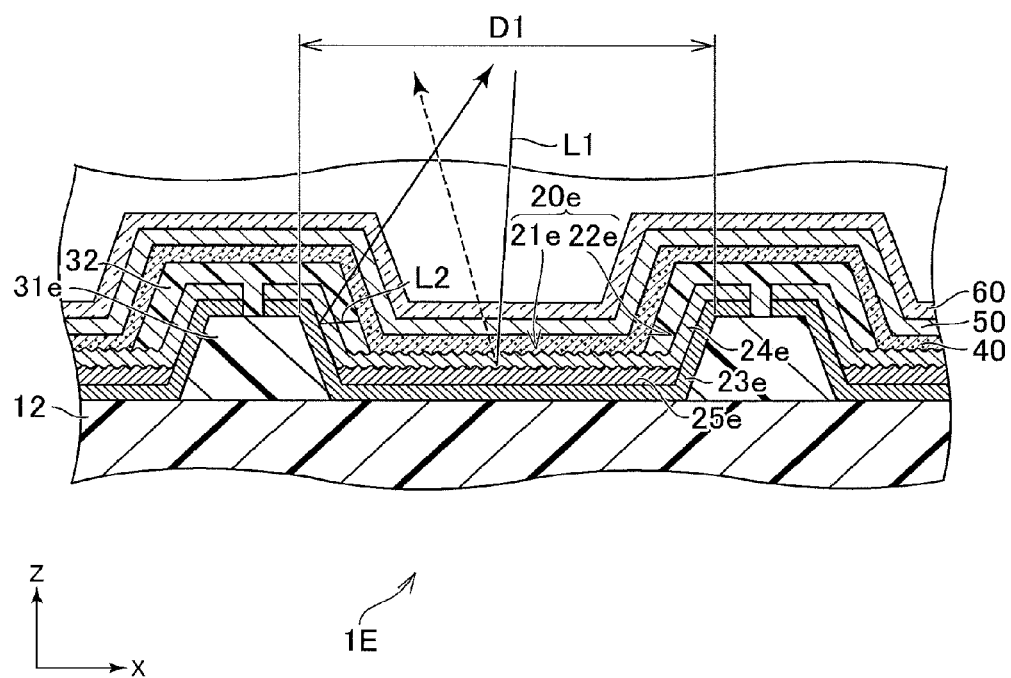
FIG. 8 is a cross-sectional view showing a portion of a cross-section of a display device according to a fifth embodiment.

Next, a display device 1E according to a fifth embodiment will be described. FIG. 8 is a cross-sectional view showing a portion of a cross-section of the display device 1E, corresponding to FIG. 3 in the first embodiment. As shown in FIG. 8, in a lower electrode 20e formed in the display device 1E, a first reflective layer 23e made of a conductive material such as metal and formed so as to cover the upper surface of the planarization layer 12 and the inclined surface of a bank layer 31e, a second reflective layer 25e similarly made of a conductive material such as metal and disposed on the first reflective layer 23e, and a conductive layer 24e made of a transparent conductive material such as ITO and disposed on the first reflective layer 23e and the second reflective layer 25e are formed, similarly to the second embodiment. The second reflective layer 25e is disposed inside the first upper opening D1 formed in the bank layer 31e. The first reflective layer 23e and the conductive layer 24e are formed over a flat portion 21e and an inclined portion 22e. The second reflective layer 25e and portions of the first reflective layer 23e and the conductive layer 24e in contact with the second reflective layer 25e constitute the flat portion 21e. Portions of the first reflective layer 23e and the conductive layer 24e not in contact with the second reflective layer 25e constitute the inclined portion 22e. The second reflective layer 25e may be formed of the same material (e.g., Al, etc.) as the first reflective layer 23e.

Similarly to the fourth embodiment, the upper surface of the second reflective layer 25e is formed so as to have a surface roughness higher than that of the upper surface of the first reflective layer 23e. Moreover, the lower surface of a portion of the conductive layer 24e located on the second reflective layer 25e is roughened corresponding to the surface roughness of the upper surface (i.e., the reflective surface of the flat portion 21e) of the second reflective layer 25e, and also the upper surface of the portion is roughened according to the lower surface. That is, the reflective surface of the flat portion 21e is formed so as to have a surface roughness higher than that of the reflective surface of the inclined portion 22e. With the configuration described above, it is possible to suppress external light reflection while ensuring the light extraction efficiency in the display device 1E.

6. Sixth Embodiment

Figure 9:
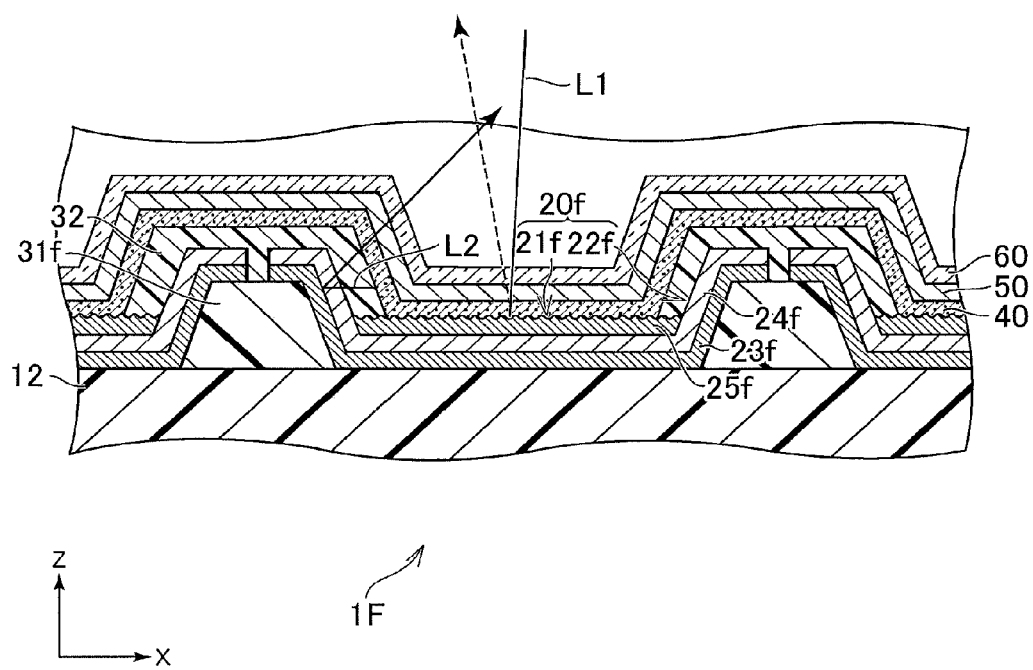
FIG. 9 is a cross-sectional view showing a portion of a cross-section of a display device according to a sixth embodiment.

Next, a display device 1F according to a sixth embodiment will be described. FIG. 9 is a cross-sectional view showing a portion of a cross-section of the display device 1F, corresponding to FIG. 3 in the first embodiment. As shown in FIG. 9, in a lower electrode 20f of the display device 1F, a conductive layer 24f made of a transparent conductive material is formed on a first reflective layer 23f that reflects light, and is in contact with the upper surface of the first reflective layer 23f over a flat portion 21f and an inclined portion 22f. A second reflective layer 25f having an upper surface rougher than the first reflective layer 23f is formed in the flat portion 21f on the conductive layer 24f. In the embodiment, the second reflective layer 25f may be formed of the same material (e.g., a metal material such as Al) as the first reflective layer 23f.

The second reflective layer 25f is disposed while avoiding the inclined portion 22f, and the first reflective layer 23f is exposed from the second reflective layer 25f in the inclined portion 22f. That is, similarly to the fourth and fifth embodiments, the reflective surface of the flat portion 21f is formed so as to have a surface roughness higher than that of the reflective surface of the inclined portion 22f. With the configuration described above, it is possible to suppress external light reflection while ensuring the light extraction efficiency in the display device 1F.

7. Seventh Embodiment

Figure 10:
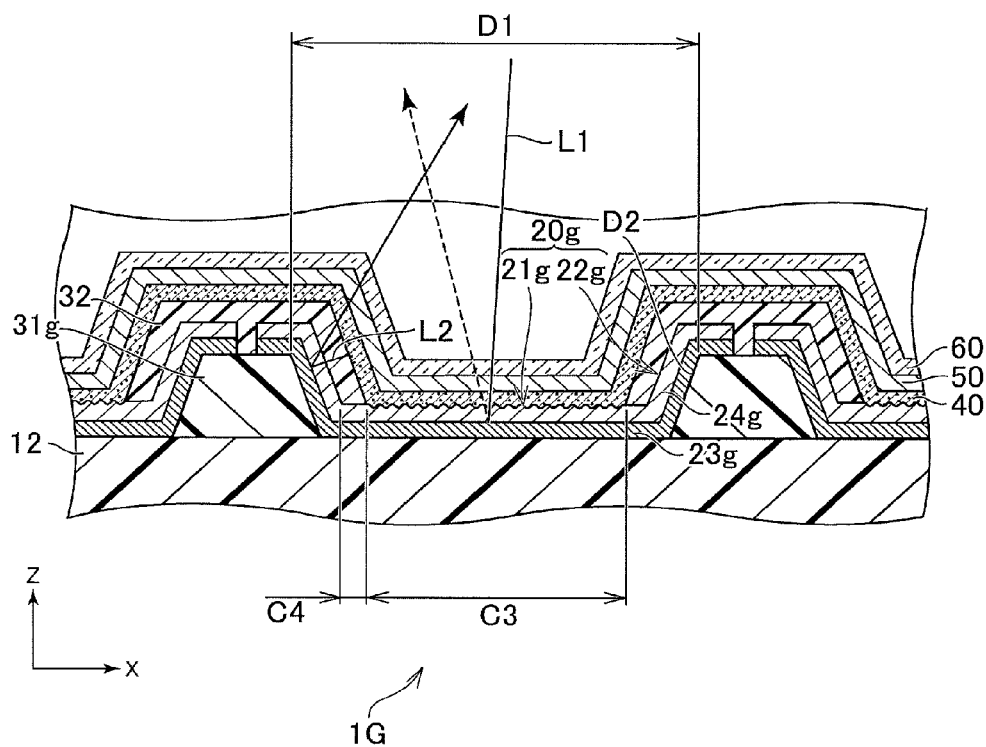
FIG. 10 is a cross-sectional view showing a portion of a cross-section of a display device according to a seventh embodiment.

Next, a display device 1G according to a seventh embodiment will be described. FIG. 10 is a cross-sectional view showing a portion of a cross-section of the display device 1G, corresponding to FIG. 3 in the first embodiment. As shown in FIG. 10, the display device 1G includes a bank layer 31g and the transparent insulating layer 32 formed so as to cover the bank layer 31g. In the bank layer 31g, the first upper opening D1 including the inner circumferential surface D2 inclined obliquely upward and outward is formed, a flat portion 21g of a lower electrode 20g is located inside the first upper opening D1, and an inclined portion 22g of the lower electrode 20g is disposed on the inner circumferential surface D2. The insulating layer 32 overlies the peripheral edge portion C4 including the peripheral edge of the flat portion 21g, and exposes the central portion C3 of the flat portion 21g including at least the center thereof.

Each of the flat portion 21g and the inclined portion 22g of the lower electrode 20g includes a reflective layer 23g including a reflective surface that reflects light, and a medium layer 24g stacked on the reflective surface and formed of a transparent conductive material. The medium layer 24g in the flat portion 21g is formed so as to have a degree of light diffuse refraction higher than that of the medium layer 24g in the inclined portion 22g. More specifically, the degree of light diffuse refraction of the medium layer 24g in the flat portion 21g is higher than that of the medium layer 24g of the inclined portion 22g in the central portion C3 of the flat portion 21g exposed from the insulating layer 32, and is equal to that of the medium layer 24g of the inclined portion 22g in the peripheral edge portion C4 including the peripheral edge of the flat portion 21g. In a manufacturing process of the display device 1G, by performing a process such as ashing on the upper surface of the medium layer 24g after forming the insulating layer 32, the upper surface of the medium layer 24g in the central portion C3 of the flat portion 21g can be roughened. By making the surface of the flat portion 21g rougher than the surface of the inclined portion 22g as described above, it is possible to suppress external light reflection while ensuring the light extraction efficiency in the display device 1G.

8. Eighth Embodiment

Figure 11:
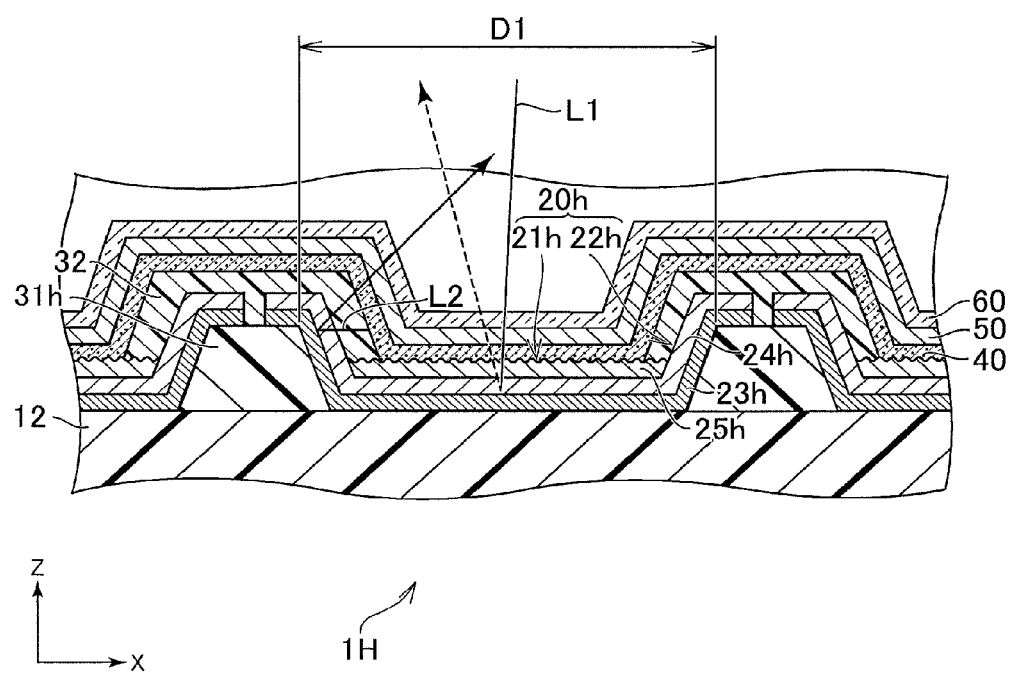
FIG. 11 is a cross-sectional view showing a portion of a cross-section of a display device according to an eighth embodiment.

Next, a display device 1H according to an eighth embodiment will be described. FIG. 11 is a cross-sectional view showing a portion of a cross-section of the display device 1H, corresponding to FIG. 3 in the first embodiment. As shown in FIG. 11, in a lower electrode 20h of the display device 1H, a first conductive layer 24h made of a transparent conductive material such as ITO is formed on a reflective layer 23h that reflects light, and is located over a flat portion 21h and an inclined portion 22h in the lower electrode 20h. Moreover, a second conductive layer 25h made of a transparent conductive material such as ITO and having a surface roughness higher than that of the first conductive layer 24h is formed on the first conductive layer 24h. The second conductive layer 25h is disposed inside the first upper opening D1.

The first conductive layer 24h is exposed from the second conductive layer 25h in the inclined portion 22h. With this configuration, the conductive layers in the flat portion 21h of the lower electrode 20h are thicker than the conductive layer in the inclined portion 22h of the lower electrode 20h, and thus have a light absorption higher than that of the conductive layer in the inclined portion 22h. Further, the flat portion 21h of the lower electrode 20h is formed so as to have a high surface roughness so that the flat portion 21h has a degree of light diffuse refraction higher than that of the inclined portion 22h. With the configuration described above, the incident light L1 incident on the flat portion 21*h* can be more attenuated than the incident light L2 incident on the inclined portion 22*h*. That is, it is possible to suppress external light reflection while ensuring the light extraction efficiency in the display device 1H.

9. Ninth Embodiment

Figure 12:
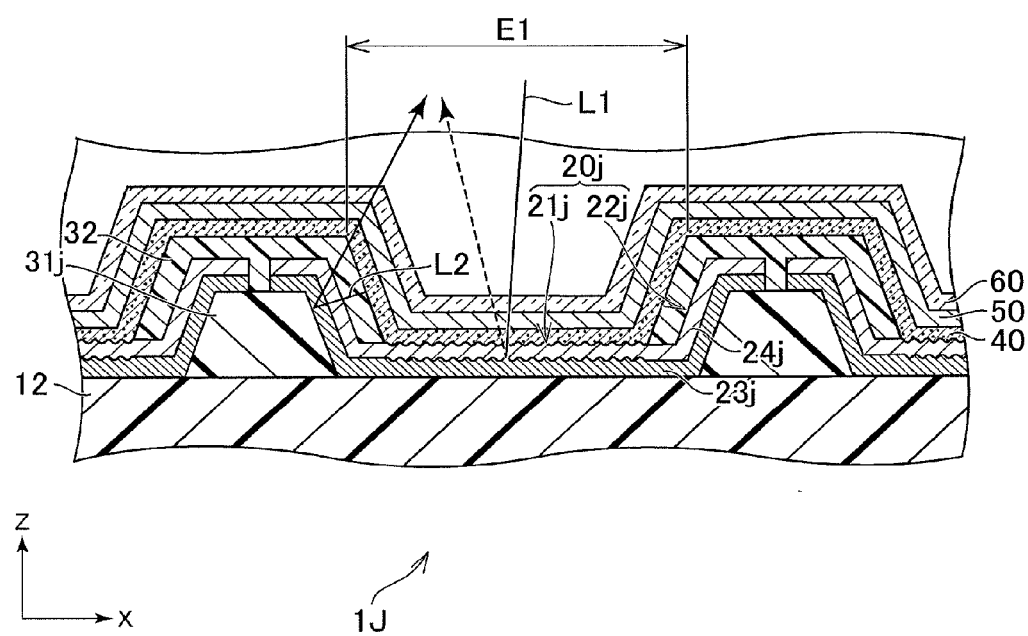
FIG. 12 is a cross-sectional view showing a portion of a cross-section of a display device according to a ninth embodiment.

Finally, a display device 1J according to a ninth embodiment will be described. FIG. 12 is a cross-sectional view showing a portion of a cross-section of the display device 1J, corresponding to FIG. 3 in the first embodiment. As shown in FIG. 11, in a lower electrode 20*j* of the display device 1J, a conductive layer 24*j* made of a transparent conductive material such as ITO is formed on a reflective layer 23*j* made of a conductive material such as metal, and is located over a flat portion 21*j* and an inclined portion 22*j* in the lower electrode 20*j*.

A portion of the reflective layer 23*j* located in the flat portion 21*j* is formed so as to have a high surface roughness compared with a portion of the reflective layer 23*j* located in the inclined portion 22*j*. In a manufacturing process of the display device 1J, by performing, after forming the reflective layer 23*j*, the conductive layer 24*j*, and the insulating layer 32, a surface treatment (e.g., ashing, ion implantation, or a sputtering process) on the upper surface of the reflective layer 23*j* as the reflective surface from above the second upper opening E1 formed in the insulating layer 32, the upper surface of the reflective layer 23*j* in the flat portion 21*j* is roughened. Moreover, the lower and upper surfaces of the conductive layer 24*j* in the flat portion 21*j* are also roughened according to the reflective layer 23*j*. By making the reflective surface of the flat portion 21*j* rougher than the reflective surface of the inclined portion 22*j* as described above, it is possible to suppress external light reflection while ensuring the light extraction efficiency in the display device 1J.

The invention is not limited to the embodiments described above, and various modifications may be made. Moreover, the disclosure of the specification is merely an example of the invention. Appropriate modifications that fall within the spirit of the invention and will readily occur to those skilled in the art are included in the scope of the invention. For example, the light-emitting layer 40 is disposed over the plurality of pixels in the embodiments, but may be disposed independently for each of the pixels. Moreover, a structure not including the color filter layer 80 may be employed. Moreover, the width, thickness, shape, and the like of each portion shown in the drawings are schematically represented, and do not limit the interpretation of the invention.

While there have been described what are at present considered to be certain embodiments of the invention, it will be understood that various modifications may be made thereto, and it is intended that the appended claim cover all such modifications as fall within the true spirit and scope of the invention.

What is claimed is:

1. A display device comprising a plurality of emitting elements corresponding to a plurality of pixels, wherein
each of the plurality of emitting elements includes
a lower electrode,
an upper electrode having a light-transmitting property, and
a light-emitting layer between the lower electrode and the upper electrode,
the lower electrode includes a flat portion and an inclined portion that is inclined obliquely upward and outward from a central area of the flat portion,
the plurality of pixels are divided by a bank layer,
the bank layer has an uppermost surface and a side surface intersecting the uppermost surface,
the bank layer has an opening including the side surface,
the side surface is inclined obliquely upward and outward,
the lower electrode includes a first layer that is located on the bank layer and inside the opening, and a second layer that is located on the first layer while avoiding overlapping at least an upper end portion of the side surface inside the opening,
the first layer includes a portion that overlaps the side surface and does not overlap the second layer,
the portion is the inclined portion,
the second layer is the flat portion,
the inclined portion is located on an entirety of the side surface,
both the flat portion and the inclined portion include a reflective surface respectively, and
the reflective surface of the flat portion has a light reflectance lower than that of the reflective surface of the inclined portion.

2. The display device according to claim 1, wherein the reflective surface of the flat portion is made of a material having a light reflectance lower than that of the reflective surface of the inclined portion.

3. The display device according to claim 2, wherein the bank layer overlies a peripheral edge area of the flat portion of the lower electrode,
the side surface is inclined obliquely upward and outward surrounding the central area.

4. The display device according to claim 1, wherein the lower electrode further includes a conductive layer having a light-transmitting property, and
the conductive layer is disposed in at least one of a first area and a second area, the first area being on the first layer and the second layer, the second area being between the first layer and the second layer.

5. The display device according to claim 1, wherein the reflective surface of the flat portion has a surface roughness higher than that of the reflective surface of the inclined portion.

6. The display device according to claim 5, wherein the lower electrode further includes a conductive layer that is stacked on and in contact with at least the flat portion chosen from between the flat portion and the inclined portion and has a light-transmitting property, and
the conductive layer includes a lower surface that is roughened corresponding to the surface roughness of the reflective surface of the flat portion, and an upper surface that is roughened according to the lower surface.

* * * * *